(12) United States Patent
Hiromatsu

(10) Patent No.: US 6,552,559 B2
(45) Date of Patent: Apr. 22, 2003

(54) IC TESTER ADJUSTING UNIT

(75) Inventor: Katsuaki Hiromatsu, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/981,651

(22) Filed: Oct. 16, 2001

(65) Prior Publication Data

US 2002/0079881 A1 Jun. 27, 2002

(30) Foreign Application Priority Data

Oct. 17, 2000 (JP) ........................................ 2000-317035

(51) Int. Cl.$^7$ .............................................. G01R 31/02
(52) U.S. Cl. ........................................ 324/758; 324/754
(58) Field of Search ................................ 324/754–755, 324/757–758, 761, 762, 158.1

(56) References Cited

U.S. PATENT DOCUMENTS

| | | | |
|---|---|---|---|
| 4,616,971 A | * | 10/1986 | Matrone ........................ 29/832 |
| 6,204,681 B1 | * | 3/2001 | Nagatsuka et al. ......... 324/754 |
| 6,441,629 B1 | * | 8/2002 | Khoury et al. .............. 324/758 |

* cited by examiner

Primary Examiner—Kamand Cuneo
Assistant Examiner—Jermele Hollington
(74) Attorney, Agent, or Firm—Flynn, Thiel, Boutell & Tanis, P.C.

(57) ABSTRACT

A measuring probe can be positioned and set on signal pads 6 without providing positioning pins on a test board. An IC tester adjusting unit includes signal pads formed on a test board for testing operating characteristics of an IC to be tested by allowing the signal pads to contact the IC to be tested to input testing input signals to the IC to be tested, and by evaluating output signals outputted from the IC to be tested relative to the testing input signals. The IC tester adjusting unit further comprises a robot, a measuring probe, and a plurality of position correcting electrodes to which fixed voltages are applied discretely disposed on the test board, wherein the measuring probe is brought into contact with the signal pads when the measuring probe is moved by the robot, thereby detecting timing of the testing input signals supplied to the signal pads so as to adjust the timing of the testing input signals based on the result of detection, and wherein positions of the position correcting electrodes are detected by the measuring probe so as to prescribe a relative positional relation between a robot coordinate system of the robot and the test board.

5 Claims, 3 Drawing Sheets

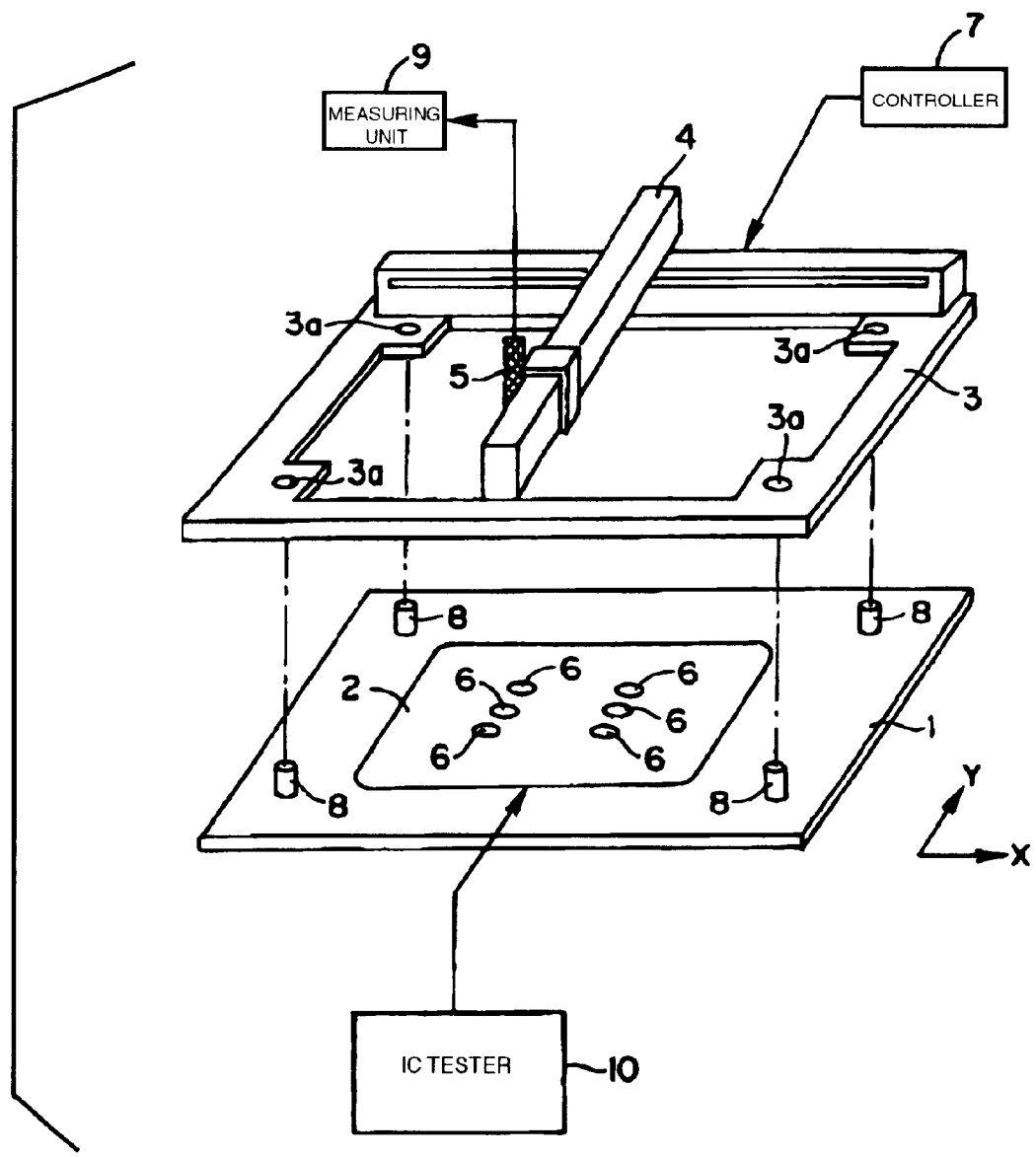

IC TESTER ADJUSTING UNIT

BACKGROUND OF THE INVENTION

1. Field of the Invention

The invention relates to an integrated circuit (IC) tester adjusting unit to be used for adjusting an IC tester.

2. Description of the Related Art

It is well known that an IC tester is a unit for testing operating characteristics of various ICs, wherein the IC tester tests whether the ICs are in a normal operating condition or not by evaluating output signals relative to testing input signals. With such an IC tester, the relation between timing of mutual testing input signals is periodically or arbitrarily adjusted, and an adjusting unit which is specially designed for the adjustment, namely, an IC tester adjusting unit is employed for such an adjustment. Adjustment of the relation between timing of the mutual testing input signals using such an IC tester adjusting unit becomes very important as ICs have been recently speeded up, and hence the number of adjustment for testing operating characteristics of ICs is increased to secure accuracy thereof.

FIG. 3 is a perspective view showing a general construction of a conventional IC tester adjusting unit. In FIG. 3, depicted by 1 is a board frame, 2 a test board, 3 a robot frame, 4 a robot, 5 a measuring probe, 6 signal pads, 7 a controller, 8 positioning pins, 9 a measuring unit, 10 an IC tester. The board frame 1 supports the test board 2 and has positioning pins 8 for adjusting a positional relation between itself and the robot frame 3 at four corners thereof.

The test board 2 is a printed-circuit board having a plurality of signal pads 6 are formed on the surface thereof, and it is mounted on the board frame 1 at a given position. Testing input signals which are to be inputted to an IC to be tested are supplied from the IC tester 10 to each of the signal pads 6. The testing input signals are supplied to the test board 2 via connectors provided on the back face of the test board 2, and then they are supplied to the signal pads 6 via pattern wirings formed on the test board In FIG. 3, six signal pads 6 are illustrated by example for explaining the general construction of the conventional IC tester adjusting unit, the signal pads 6 are formed on the test board 2 by the number corresponding to the testing input signals to be inputted to the IC to be tested. With the test board 2 for testing a plurality of ICs, many signal pads 6 are formed on the test board 2 by the number obtained by multiplying the number of testing input signals by the number of ICs. Such signal pads 6 are brought into contact with under pressure and connected to each input pin of the ICs to be tested when testing the ICs via relay pins so that the testing input signals are inputted to each input pin.

The robot frame 3 is a metal frame for supporting the robot 4, and has positioning holes 3a which engage with the positioning pins 8 at four corners thereof. The robot 4 positions and sets the measuring probe 5 on each of the signal pads 6 by moving the measuring probe 5 dimensionally within an X-Y plane which is in parallel with the test board 2, and it also lowers the measuring probe 5 to allow the measuring probe 5 to contact the signal pads 6 under pressure. The measuring probe 5 supplies testing input signals, which are to be supplied to the signal pads 6, to the measuring unit 9. The controller 7 controls the operation of the robot 4. The measuring unit 9 measures timing of input signals.

With the IC tester adjusting unit having the foregoing construction, the measuring probe 5 is positioned and set onto the signal pads 6 by the operation of the robot 4. When the positioning pins 8 of the board frame 1 is engaged or filled in the positioning holes 3a of the robot frame 3, the positional relation between the robot 4 and the test board 2 is prescribed with high accuracy so that the robot 4 can position and set the measuring probe 5 onto the signal pads 6 with accuracy. When the measuring probe 5, which was positioned and set onto the signal pads 6 with accuracy, is brought into contact with the signal pads 6, the testing input signals are supplied to the measuring unit 9 where timing between the testing input signals are measured so that the IC tester 10 is adjusted in the manner that timing of the testing input signals become a given timing relation.

However, the conventional IC tester adjusting unit has the following problem.

(1) Since the positioning pins 8 need to be provided on the board frame 1, a cost of the IC tester adjusting unit increases by such a provision of the positioning pins 8.

(2) The positioning pins 8 restrict the design of the test board 2, namely, it is necessary to design the size and shape of the test board 2 considering the presence of the positioning pins 8.

(3) If the board frame 1 and test board 2 are deformed under the influence of an ambient temperature and the like, the positional displacement between the measuring probe 5 and signal pads 6 caused by this deformation cannot be corrected.

(4) If the signal pads 6 are further reduced in an area and highly integrated, the measuring probe 5 cannot be positioned and set onto the signal pads 6 with accuracy.

SUMMARY OF THE INVENTION

The invention has been developed to overcome the foregoing problems of the conventional IC tester adjusting unit, and has the following objects.

(1) The measuring probe can be positioned and set onto the signal pads with high accuracy without providing the positioning pins on the board frame.

(2) A cost of the IC tester adjusting unit can be reduced.

(3) Degree of freedom in designing the test board is improved.

(4) The measuring probe can be positioned and set onto the signal pads with high accuracy regardless of the deformation of the board frame or test board or tendency of small area and high integration of the signal pads.

To achieve the above objects, the invention adopts an IC tester adjusting unit as first means including signal pads 6 formed on a test board 2' for testing operating characteristics of an IC to be tested by allowing the signal pads 6 to contact the IC to be tested to input testing input signals to the IC to be tested, and by evaluating output signals outputted from the IC to be tested relative to the testing input signals, said IC tester adjusting unit further comprising a robot 4, a measuring probe 5, and a plurality of position correcting electrodes 11 to which fixed voltages are applied discretely disposed on the test board 2', wherein the measuring probe 5 is brought into contact with the signal pads 6 when the measuring probe 5 is moved by the robot 4, thereby detecting timing of the testing input signals supplied to the signal pads 6 so as to adjust the timing of the testing input signals based on the result of detection and wherein positions of the position correcting electrodes 11 are detected by the measuring probe 5 so as to prescribe a relative positional relation between a robot coordinate system of the robot 4 and the test board 2'.

The invention adopts the IC tester adjusting unit as second means wherein in the first means three position correcting electrodes 11 are disposed on the test board 2' so as to form a triangle as large as possible while apexes of the triangle are expanded to the utmost on the test boards 2'.

The invention adopts the IC tester adjusting unit as third means wherein in the first or second means the positions of the position correcting electrodes 11 are detected by detecting voltages on the position correcting electrodes 11 and a plurality of points around the periphery of the position correcting electrodes 11.

The invention adopts the IC tester adjusting unit as fourth means wherein in any of the first to third means each position correcting electrode 11 is circular, and a central point of each position correcting electrode 11 is detected as a position of each position correcting electrode 11.

The invention adopts the IC tester adjusting unit as fifth means wherein in any of first to fourth means, the signal pads 6 are used instead of the position correcting electrodes 11.

BRIEF DESCRIPTION OF THE DRAWINGS

FIG. 3 is a perspective view showing a general construction of the conventional IC tester adjusting unit.

PREFERED ENBODIMENT OF THE INVENTION

Figure 1:
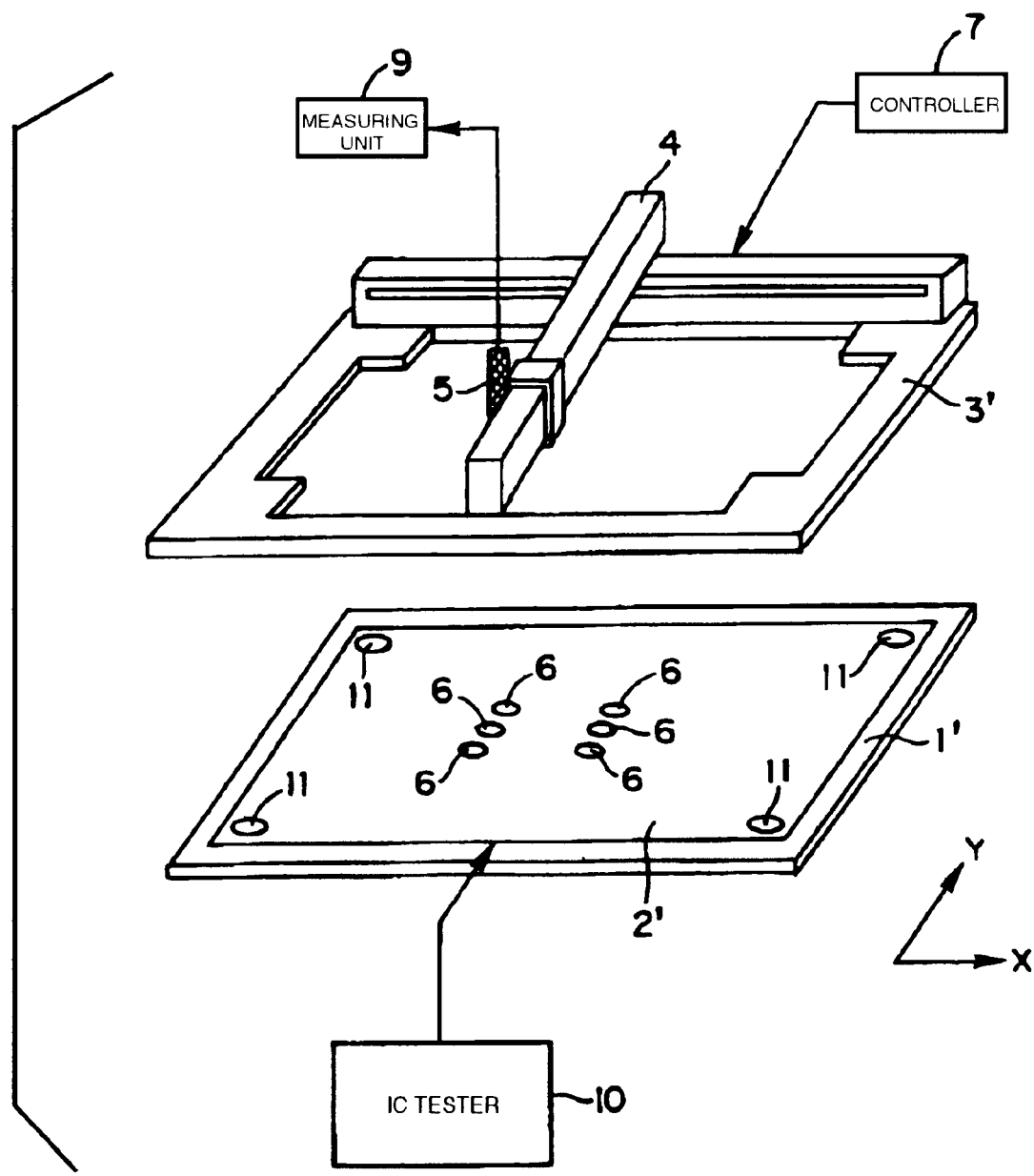
FIG. 1 is a perspective view showing a general construction of an IC tester adjusting unit according to a preferred embodiment of the invention.

A IC tester adjusting unit according to a preferred embodiment of the invention is now described hereinafter with reference to the attached drawings. In the following description, components which have been already explained are depicted by the same reference numerals, and the explanation thereof is omitted.

FIG. 1 is a perspective exploded view showing the general construction of the IC tester adjusting unit of the invention. As shown in FIG. 1, the IC tester adjusting unit of the invention is different from the conventional IC tester adjusting unit in respect of constructions of a board frame 1', a test board 2' and a robot frame 3'. That is, the board frame 1' has no conventional positioning pins 8 and the robot frame 3' has no conventional positioning holes 3a engaging with the conventional positioning pins 8. Position correcting electrodes 11 are provided on the test board 2' for substituting them with the conventional positioning pins 8 and positioning holes 3a.

The position correcting electrodes 11 are discretely disposed so as to form a rectangle at four corners or a triangle at least three corners on the square test board 2', and a fixed dc is applied to the position correcting electrodes 11. The shape of each position correcting electrode 11 is, e.g., circular. The position correcting electrodes 11 are positioned to be as close to each corner of the test board 2' as possible so that an area of the rectangle (or a right-angled triangle) becomes as large as possible. Since the board frame 1' has no conventional positioning pins 8, it is not necessary to consider the conventional positioning pins 8 when designing the test board 2', so that the test board 2' can be formed larger than the conventional test board 2.

The relative position relation between the robot 4 (exactly a robot coordinate system of the robot 4) and the test board 2' using the position correcting electrodes 11 is calculated in the following manner.

According to the preferred embodiment of the invention, the IC tester adjusting unit has no conventional positioning pins 8 and the positioning holes 3a, the positional relation between the board frame 1' and robot frame 3' is not prescribed with high accuracy. Accordingly, a coordinate system inherent to the robot 4 fixed to the robot frame 3', namely, a relative positional relation between the robot coordinate system and the test board 2' fixed onto the board frame 1' is not prescribed with high accuracy in an initial state so that the robot 4 cannot position and set the measuring probe 5 onto the signal pads 6 with high accuracy.

However, the robot 4 can calculate and detect the relative positional relation between the robot coordinate system and the test board 2' with high accuracy by detecting correct positions of the position correcting electrodes 11 using the measuring probe 5 in the following way. The robot 4 can position and set the measuring probe 5 onto the signal pads 6 based on the result of calculation and detection by the measuring probe 5.

That is, although the positional relation between the board frame 1' and robot frame 3' is not prescribed with high accuracy, the robot 4 can position and set the measuring probe 5 onto the position correcting electrodes 11 at approximate positions, so that the measuring probe 5 can probe locations close to the approximate positions of the position correcting electrodes 11 at fixed intervals, thereby calculating and detecting correct positions of the position correcting electrodes 11.

Figure 2:
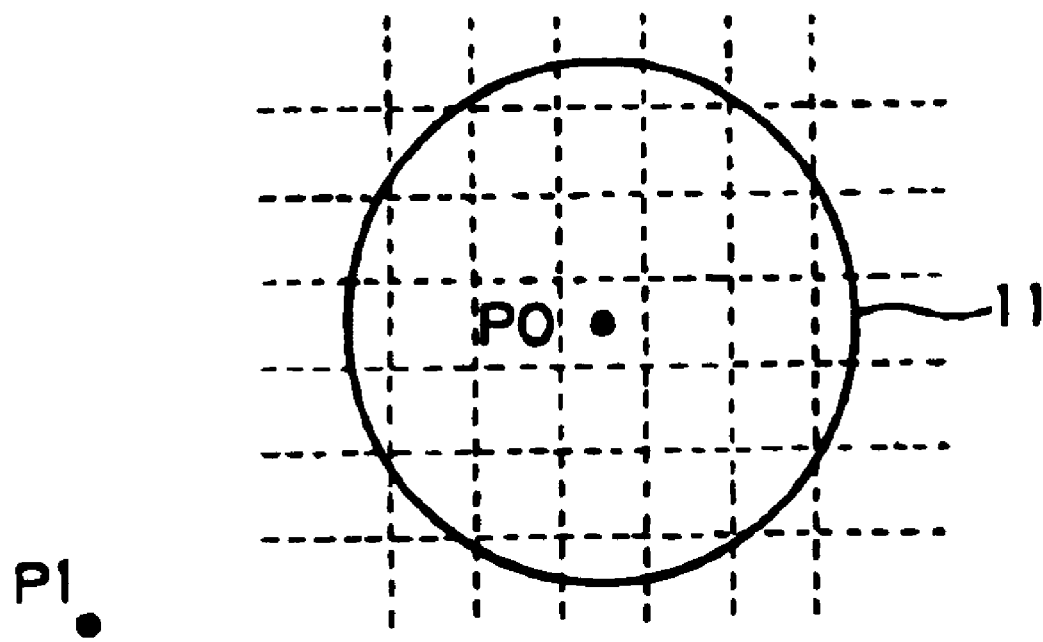
FIG. 2 is a view showing a concept how to detect positions of position correcting electrodes.

FIG. 2 is a view showing how to detect positions of the position correcting electrodes 11. Depicted by a point P1 is one of approximate positions where the measuring probe 5 is initially positioned and set close to the position correcting electrodes 11. When the robot 4 is moved to the point P1, the measuring probe 5 probes the periphery of the point P1 so that the position correcting electrodes 11, namely, dc voltages applied to the position correcting electrodes 11 are detected, and hence a relative position of each position correcting electrode 11 relative to the point P1 is approximately detected. When voltages on each crossing point of a right-angled grid shown in broken lines are detected so as to detect correct position of a central point P0 of each circular position correcting electrode 11, the central point P0 of each position correcting electrode 11 is calculated based on the voltages on each crossing point.

The calculation of the central point P0 of each position correcting electrode 11 is applied to all the position correcting electrodes 11, so that a positional relation between the test board 2' relative to the the robot frame 3' on the X-Y plane, namely, a positional relation therebetween in an X direction and a Y direction and an angle therebetween on the X-Y plane can be calculated and detected with high accuracy.

According to the preferred embodiment of the invention, since the positional relation between the robot frame 3' and test board 2' is prescribed by calculating and detecting positions of a plurality of position correcting electrodes 11 provided on the test board 2' without prescribing a mechanical position between the board frame 1' and the robot frame 3' by the conventional positioning pins 8 and positioning holes 3a, the measuring probe 5 can be positioned and set onto the signal pads 6 without being influenced by the deformation of the board frame 1' or test board 2' or tendency of small areas and high integration of the signal pads 6. Further, since each position correcting electrode 11 can be provided on the board frame 1' in the manner that an area of a rectangle (or triangle) formed by the position correcting electrodes 11 becomes as large as possible, the positional relation between the robot frame 3' and the test board 2' can be prescribed with more high accuracy.

Although the position correcting electrodes 11 are provided separately according to the preferred embodiment of the invention, the signal pads 6 may be used instead of the position correcting electrodes 11. That is, four or three signal pads 6 forming a rectangle or a triangle which becomes as large as possible are selected from a plurality of signal pads 6, and fixed dc voltages are applied to the signal pads 6 so as to be substituted with the position correcting electrodes 11. In this case, the preferred embodiment of the invention can be also applied to a known test board.

According to the IC tester adjusting unit of the preferred embodiment of the invention, it is possible to position and set the measuring probe onto the signal pads with high accuracy without providing positioning pins on the board frame as made in the prior art, or even if the board frame or the test board is deformed, or the signal pads are reduced in a size or area and highly integrated, because the relative positional relation between the robot coordinate system of the robot and the test board can be prescribed by discretely disposing a plurality of position correcting electrodes to which fixed dc voltages are applied on the test board, and by detecting positions of the position correcting electrodes by the measuring probe. Accordingly, a cost of the IC tester adjusting unit can be reduced and also degree of freedom in designing the test board can improved.

What is claimed is:

1. An IC tester adjusting unit including signal pads formed on a test board for testing operating characteristics of an IC to be tested by allowing the signal pads to contact the IC to be tested to input testing input signals to the IC to be tested, and by evaluating output signals outputted from the IC to be tested relative to the testing input signals, said IC tester adjusting unit further comprising a robot, a measuring probe, and a plurality of position correcting electrodes to which fixed voltages are applied discretely disposed on the test board;

wherein the measuring probe is brought into contact with the signal pads when the measuring probe is moved by the robot, thereby detecting timing of the testing input signals supplied to the signal pads so as to adjust the timing of the testing input signals based on the result of detection; and wherein positions of the position correcting electrodes are detected by the measuring probe so as to prescribe a relative positional relation between a robot coordinate system of the robot and the test board.

2. The IC tester adjusting unit according to claim 1, wherein three position correcting electrodes are disposed on the test board so as to form a triangle as large as possible while apexes of the triangle are expanded to the utmost on the test boards.

3. The IC tester adjusting unit according to claim 1, wherein the positions of the position correcting electrodes are detected by detecting voltages on the position correcting electrodes and a plurality of points around the periphery of the position correcting electrodes.

4. The IC tester adjusting unit according to claim 1, wherein each position correcting electrode is circular, and a central point of each position correcting electrode is detected as a position of each position correcting electrode.

5. The IC tester adjusting unit according to claim 1, wherein the signal pads are used instead of the position correcting electrodes.

* * * * *